(12) United States Patent
Wong et al.

(10) Patent No.: US 8,130,980 B2
(45) Date of Patent: Mar. 6, 2012

(54) AUTOMATIC GAIN CONTROL CIRCUIT FOR VOLUME CONTROL AND CORRESPONDING METHOD FOR VOLUME CONTROL

(75) Inventors: Kok Ghay Wong, Singapore (SG);
Thean Kuie Christopher Chang, Singapore (SG); Chee Sin Cheah, Singapore (SG); Huoy Ru Rachel Koh, Singapore (SG)

(73) Assignee: Creative Technology Ltd, Singapore (SG)

( * ) Notice: Subject to any disclaimer, the term of this patent is extended or adjusted under 35 U.S.C. 154(b) by 1293 days.

(21) Appl. No.: 11/766,734

(22) Filed: Jun. 21, 2007

(65) Prior Publication Data

US 2008/0318539 A1    Dec. 25, 2008

(51) Int. Cl.
*H03G 3/00* (2006.01)
(52) U.S. Cl. ............ 381/107; 381/28; 381/98; 381/101; 381/102; 381/104; 381/106; 381/120
(58) Field of Classification Search .................. 381/107, 381/28, 98, 101, 102, 104, 106, 120; 455/232.1, 455/234.1
See application file for complete search history.

(56) References Cited

U.S. PATENT DOCUMENTS

| | | | | |
|---|---|---|---|---|
| 5,170,437 A * | 12/1992 | Strahm | ......................... | 381/106 |
| 5,359,665 A * | 10/1994 | Werrbach | ..................... | 381/102 |
| 7,415,119 B2 * | 8/2008 | Boss et al. | .................... | 381/107 |
| 2005/0047615 A1 * | 3/2005 | Kawamura et al. | ........... | 381/120 |

* cited by examiner

*Primary Examiner* — Vivian Chin
*Assistant Examiner* — Paul Kim
(74) *Attorney, Agent, or Firm* — Creative Technology Ltd

(57) ABSTRACT

There is provided an automatic gain control circuit for volume control receiving at least one audio signal input via either a wired connection or a wireless connection. The circuit includes an output signal regulator receiving a first portion of the at least one audio signal input, with the regulator being able to vary an amplitude of the first portion of the at least one audio signal input when a control signal from a circuit controller is received. The circuit controller may be powered by a DC generator; with the DC generator receiving a second portion of the at least one audio signal input. A signal from the output signal regulator may be passed through an acoustic generator. It is preferable that the first portion of the at least one audio signal input is substantially more than the second portion. It is also preferable that the output signal regulator varies the amplitude of the at least one audio signal input by reducing the amplitude. A corresponding method of volume control is also disclosed.

19 Claims, 3 Drawing Sheets

AUTOMATIC GAIN CONTROL CIRCUIT FOR VOLUME CONTROL AND CORRESPONDING METHOD FOR VOLUME CONTROL

FIELD OF INVENTION

This invention relates to an automatic gain control circuit which does not require a power source, the circuit being used for volume control. A corresponding method for volume control is also disclosed.

BACKGROUND

In recent years, demand for personal entertainment devices has been growing at an astonishing rate. Many of these personal entertainment devices are portable and they are often used together with earphones/headphones. While listening to audio output from these devices using the earphones/headphones, users tend to increase the volume level to unhealthy levels because of either noisy environments or because of personal preference. Kids and teenagers are especially likely to do this given their lack of knowledge in relation to the possibility of hearing loss.

Medical guidelines have stated that a volume level for human ears becomes unhealthy once ambient sounds are drowned out by sounds emanating from the earphones/headphones. When an individual is subjected to unhealthy volume levels for an extended period of time, sensitive structures of the inner ear may get damaged. When such damage occurs, permanent noise-induced hearing loss (NIHL) is the sad consequence. NIHL is irreversible, but may be prevented with good listening practices. However, the application of good listening practices is still a personal choice which the individual will have to make. Unfortunately, knowledge of the dangers of hearing loss and guidance from parents/peers may not be adequate to ensure that the individual adopts good listening practices. In this regard, there exists a need to automatically restrict volume levels within healthy levels to aid in the adoption of good listening practices.

It should be noted that many of the personal entertainment devices are portable and have limitations in relation to power capacity. It would be highly desirable if an ability to automatically restrict volume levels did not impose a power cost on a power source in the personal entertainment device.

SUMMARY

There is provided an automatic gain control circuit for volume control receiving at least one audio signal input via either a wired connection or a wireless connection. The circuit includes an output signal regulator receiving a first portion of the at least one audio signal input, with the regulator being able to vary an amplitude of the first portion of the at least one audio signal input when a control signal from a circuit controller is received. The circuit controller may be powered by a DC generator; with the DC generator receiving a second portion of the at least one audio signal input. A signal from the output signal regulator may be passed through an acoustic generator. It is preferable that the first portion of the at least one audio signal input is substantially more than the second portion. It is also preferable that the output signal regulator varies the amplitude of the at least one audio signal input by reducing the amplitude.

It is preferable that the DC generator has a minimal loading effect on a source of the at least one audio signal input. The DC generator may comprise an arrangement of diodes in combination with capacitors, the generator being able to generate a DC signal from the second portion of the at least one audio signal input.

It is preferable that the circuit controller is a component such as, for example, switch, relay, transistor and MOSFET. It is also preferable that the output signal regulator includes at least two resistors in a parallel circuit arrangement. It is advantageous that a resistance of each of the at least two resistors determines a predetermined level for the amplitude of the at least one audio signal input. It is also advantageous that the control signal from the circuit controller is received by the output signal regulator when the amplitude of the at least one audio signal input exceeds the predetermined level. Alternatively, the output signal regulator may further receive an ambient environment audio input, with the ambient environment audio input determining the predetermined level.

The at least one audio signal input may be analog.

There is also provided a method for volume control, including receiving at least one audio signal via either a wired connection or a wireless connection; dividing the at least one audio signal into a first portion passing into an output signal regulator and a second portion passing into a DC generator; activating the output signal regulator to vary an amplitude of the first portion of the at least one audio signal when a control signal from a circuit controller is received; and passing a signal from the output signal regulator into an acoustic generator. Preferably, the DC generator powers the circuit controller. It is preferable that the first portion of the at least one audio signal is substantially more than the second portion.

Advantageously, the circuit controller transmits the control signal when an amplitude of the at least one audio signal input exceeds a predetermined level. Alternatively, the output signal regulator may receive an ambient environment audio input, with the ambient environment audio input determining the predetermined level. The output signal regulator may vary the amplitude of the at least one audio signal input by reducing the amplitude.

DESCRIPTION OF DRAWINGS

In order that the present invention may be fully understood and readily put into practical effect, there shall now be described by way of non-limitative example only preferred embodiments of the present invention, the description being with reference to the accompanying illustrative drawings.

DESCRIPTION OF PREFERRED EMBODIMENTS

Figure 1:
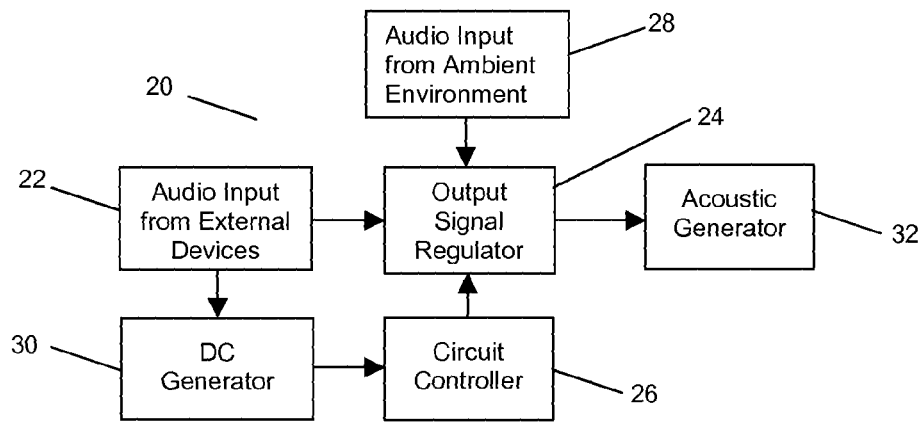
FIG. 1 shows a block diagram of a present invention.

Referring to FIG. 1, there is shown a block diagram of an automatic gain control circuit 20 for volume control. The circuit includes at least one audio signal input 22 from an external device, such as, for example, a portable media player, a magnetic media playback device, FM receivers, PCs and the like. The at least one audio signal input 22 generally refers to the audio sounds received by a user playing back content on the external device. The at least one audio signal input 22 may be analog. The at least one audio signal 22 may be received via either a wired connection or a wireless connection. The wireless connection may be using wireless technologies such as, for example, Bluetooth, WiFi, WiMax and the like.

The circuit 20 includes an output signal regulator 24. The output signal regulator 24 receives a first portion of the at least one audio signal input 22 and is able to vary an amplitude of the first portion of the at least one audio signal input 22. However, the output signal regulator 24 only varies the amplitude of the first portion of the at least one audio signal input 22 when a control signal is received from another part of the circuit 20, a circuit controller 26. The circuit controller 26 may be a component such as, for example, switch, relay, transistor, MOSFET and the like. The control signal from the circuit controller 26 may be transmitted to the output signal regulator 24 when the amplitude of the at least one audio signal input 22 exceeds a predetermined level. The predetermined level may be permanently set during manufacture of the output signal regulator 24. The setting of the predetermined level will be discussed in further detail in a subsequent section of the description. The variation of the amplitude of the first portion of the at least one audio signal input 22 may be in terms of reducing the amplitude.

In an alternative embodiment of the present invention, the output signal regulator 24 may receive an audio input from the ambient environment 28, essentially receiving an input in relation to ambient sound levels. The predetermined level may be dynamically determined according to the sound levels of the ambient environment. It is thus expected that the louder the ambient sound levels, the higher the predetermined level. The audio input from the ambient environment may be a microphone 28 picking up ambient sounds. This alternative embodiment may be convenient for the user, but may be duration restricted to prevent excessive damage to the user's ears.

The circuit controller 26 may be powered by a DC generator 30 with the DC generator 30 receiving a second portion of the at least one audio signal input 22. It should be noted that the DC generator 22 has a minimal loading effect on the external device transmitting the at least one audio signal input 22. In this regard, the first portion of the at least one audio signal input 22 is substantially more than the second portion of the at least one audio signal input 22.

Finally, a signal from the output signal regulator 24 is passed through an acoustic generator 32. The signal from the output signal regulator 24 is unmodified if the at least one audio signal input 22 has a lower amplitude than the predetermined level.

The circuit 20 may be incorporated into apparatus for reproduction of audio signals such as, for example, headsets, headphones, earphones and the like. Alternatively, the circuit 20 may be separate but functionally attachable to the aforementioned apparatus. Given that the aforementioned apparatus usually draw only a small amount of current, the circuit 20 with its low power requirement is very suitable for use with the aforementioned apparatus without any adverse effect.

Figure 2:
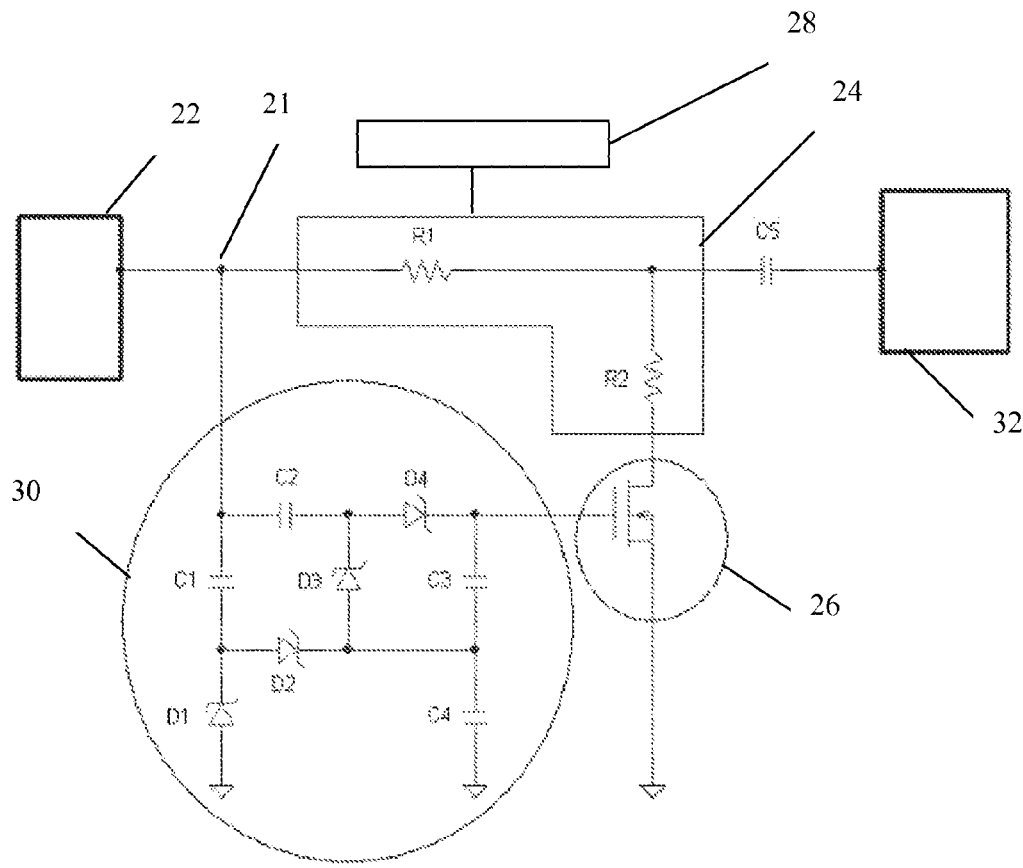
FIG. 2 shows a circuit arrangement of a first embodiment of the present invention.
Figure 3A:
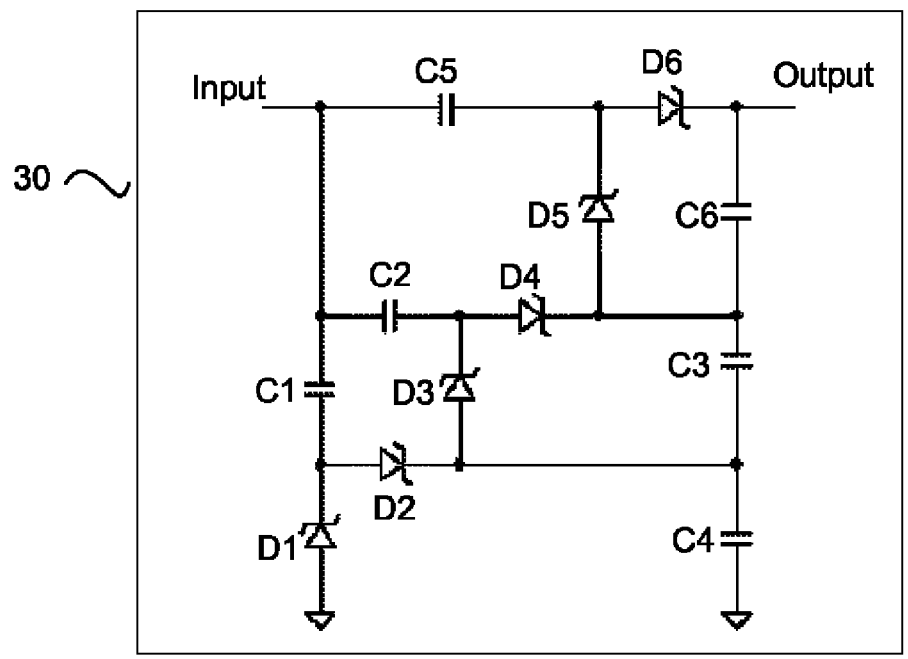
FIGS. 3A and 3B show some examples of circuit arrangements of a DC generator of the present invention.
Figure 3B:
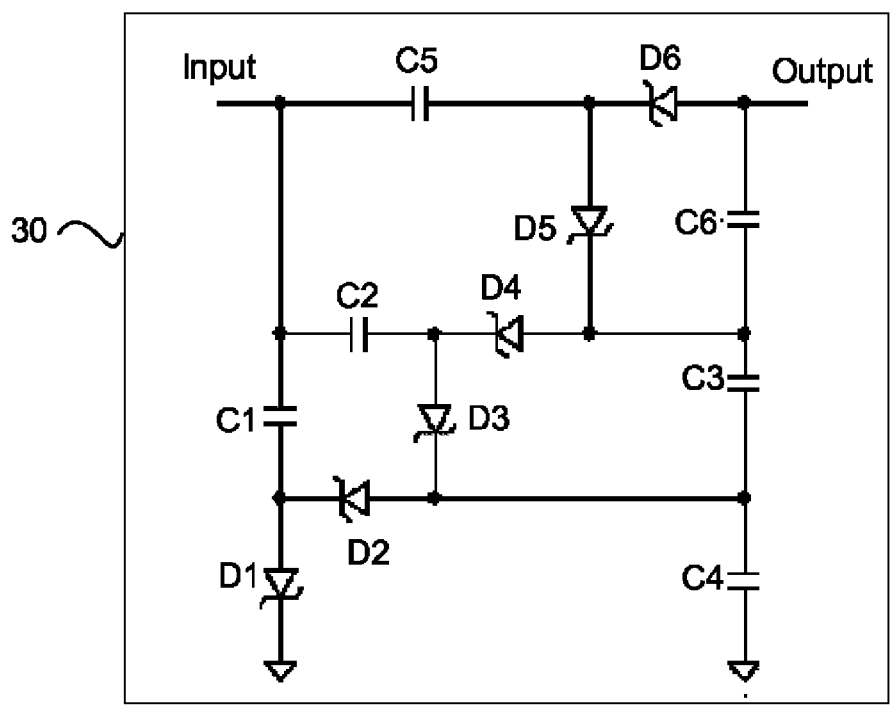
Figure 4:
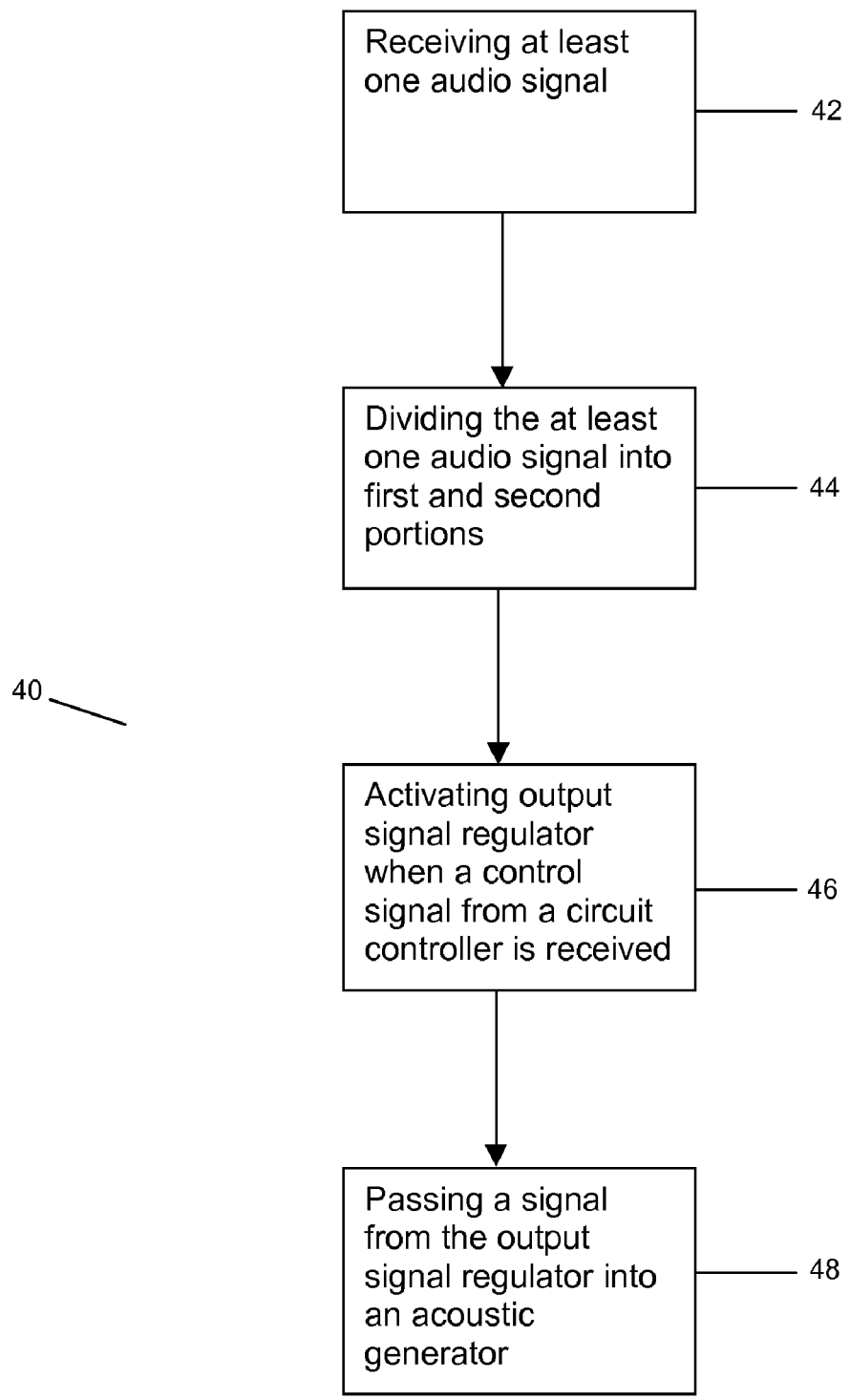
FIG. 4 shows a flow chart for a method of the present invention.

FIG. 2 shows a circuit arrangement of a first embodiment of the present invention. The labeling of FIG. 2 follows that of FIG. 1 whereby identical components have the same numeral notations. A first junction 21 shows where the at least one audio signal input 22 separates into the first portion transmitted into the output signal regulator 24 and the second portion transmitted into the DC generator 30. It can be seen from FIG. 2 that the DC generator 30 comprises an arrangement of diodes (D1, D2, D3 and D4) in combination with capacitors (C1, C2, C3 and C4). As its name suggests, the DC generator 30 is able to generate a DC signal from the second portion of the at least one audio signal input 22. Such an arrangement of diodes and capacitors is able to retrieve and amplify a peak value of DC components of the second portion of the at least one audio signal input 22. Alternative arrangements of the DC generator 30 are shown in FIGS. 3A and 3B. The various setups for the DC generator 30 shown in FIGS. 2, 3A and 3B may depend on the current rating for the apparatus for reproduction of audio signals that the circuit 20 is functionally attached to or incorporated within. FIGS. 3A and 3B show setups for the DC generator 30 that are for lower current ratings than the setup for the DC generator 30 shown in FIG. 2. The setup in FIG. 3A shows a positive DC generator while the setup in FIG. 3B shows a negative DC generator. It should be noted that the examples shown in FIGS. 2, 3A and 3B for the setup of the DC generator 30 are not meant to be restrictive, and variations should be construed to fall within the disclosure of the present invention.

In FIG. 2, the circuit controller 26 is shown to be a MOSFET. The circuit controller 26 activates the output signal regulator 24 to vary the amplitude of the first portion of the at least one audio signal input 22 when the amplitude of the at least one audio signal input 22 exceeds the predetermined level. The output signal regulator 24 only varies the amplitude of the first portion of the at least one audio signal input 22 when a control signal is received from the circuit controller 26. The variation of the amplitude of the first portion of the at least one audio signal input 22 may be in terms of reducing the amplitude.

In this first embodiment of the present invention, the output signal regulator 24 is shown to include at least two resistors (R1 and R2) in a parallel circuit arrangement. Resistance values of each of the at least two resistors (R1 and R2) may determine the predetermined level described earlier. For example, if R1=10R and R2=2R, there will be a predetermined level of approximately 13 dB lower when there is a load of 32R.

The calculation based on the above figures is as follows (some intermediate steps have been omitted as the calculation below should still be understood by a skilled person in the art):

Output from the regulator 24 when it is activated, $$V_{out(on)} = \frac{32R // 2R}{(32R // 2R) + 10R} \times V_{in} = \frac{\frac{32}{17}}{\frac{202}{17}} \times V_{in} = \frac{32}{202} \times V_{in}$$

Similarly, output from the regulator 24 when it is not activated, $$V_{out(off)} = \frac{32R}{32R + 10R} \times V_{in} = \frac{32}{42} \times V_{in}$$

Thus, $$\text{level of regulation} = 20 \text{ Log} \frac{V_{out(on)}}{V_{out(off)}} = 20 \text{ Log} \frac{\frac{32}{202}}{\frac{32}{42}} = -13.64 \text{ dB}$$

It should be noted that a negative value for the level of regulation represents "a reduction".

The output signal regulator 24 may receive an audio input from the ambient environment 28, essentially receiving an input in relation to ambient sound levels. The predetermined level may be dynamically determined according to the sound levels of the ambient environment. It is thus expected that the louder the ambient sound levels, the higher the predetermined level. The audio input from the ambient environment may be a microphone 28 picking up ambient sounds. This dynamic determination of the predetermined level may be convenient for the user, but may be duration restricted to prevent excessive damage to the user's ears.

The capacitor C5 acts as a DC filter before the signal from the output signal regulator 24 is passed through the acoustic generator 32. Thus, the capacitor C5 aids in preventing damage to the acoustic generator 32.

In another aspect of the present invention, there is provided a method 40 for volume control. The method 40 includes receiving at least one audio signal (42). The at least one audio signal may be analog and may be received via either a wired connection or a wireless connection. The wireless connection may be via wireless technologies such as, for example, Bluetooth, WiFi, WiMax and the like.

Next, the method includes dividing the at least one audio signal into a first portion and a second portion (44). It is preferable that the first portion is substantially more than the second portion. The first portion may be passed into an output signal regulator while the second portion may be passed into a DC generator. The output signal regulator may be activated to vary an amplitude of the first portion of the at least one audio signal when a control signal from a circuit controller is received (46). The circuit controller may be powered by the DC generator. The control signal from the circuit controller may be transmitted when an amplitude of the at least one audio signal input exceeds a predetermined level. The predetermined level may be permanently set during manufacture of the output signal regulator or may be dynamically determined according to the sound levels of the ambient environment. Dynamic determination of predetermined levels may be by the output signal regulator receiving an ambient environment audio input and correspondingly determining the predetermined level. The variation of the amplitude of the first portion of the at least one audio signal input may be in terms of reducing the amplitude. Finally, the method 40 includes passing a signal from the output signal regulator into an acoustic generator (48).

The method 40 may be employed by apparatus for reproduction of audio signals such as, for example, headsets, headphones, earphones and the like. Given that the aforementioned apparatus usually draw only a small amount of current, the method 40 with its low power requirement is very suitable for use with the aforementioned apparatus without any adverse effect.

Whilst there has been described in the foregoing description preferred embodiments of the present invention, it will be understood by those skilled in the technology concerned that many variations or modifications in details of design or construction may be made without departing from the present invention.

What is claimed is:

1. An automatic gain control circuit for volume control receiving at least one audio signal input, including:
   an output signal regulator receiving a first portion of the at least one audio signal input, the regulator being able to vary an amplitude of the first portion of the at least one audio signal input when a control signal from a circuit controller is received;
   the circuit controller being powered by a DC generator; and
   the DC generator receiving a second portion of the at least one audio signal input,
   wherein a signal from the output signal regulator is passed through an acoustic generator,
   wherein the output signal regulator is configurable for determining a predetermined level for the amplitude of the at least one audio signal input, and
   wherein the control signal from the circuit controller is receivable by the output signal regulator when the amplitude of the at least one audio signal input exceeds the predetermined level.

2. The circuit of claim 1, wherein the DC generator has a minimal loading effect on a source of the at least one audio signal input.

3. The circuit of claim 2, wherein the DC generator comprises an arrangement of diodes in combination with capacitors, the generator being able to generate a DC signal from the second portion of the at least one audio signal input.

4. The circuit of claim 1, wherein the circuit controller is a component selected from the group consisting of: switch, relay, transistor and MOSFET.

5. The circuit of claim 1, wherein the output signal regulator includes at least two resistors in a parallel circuit arrangement.

6. The circuit of claim 5, wherein a resistance of each of the at least two resistors determines the predetermined level for the amplitude of the at least one audio signal input.

7. The circuit of claim 1, wherein the first portion is substantially more than the second portion.

8. The circuit of claim 1, wherein the at least one audio signal is received via either a wired connection or a wireless connection.

9. The circuit of claim 1, wherein the output signal regulator is configurable in a manner so as to receive an ambient environment audio input, with the ambient environment audio input determining the predetermined level.

10. The circuit of claim 1, wherein the output signal regulator varies the amplitude of the at least one audio signal input by reducing the amplitude.

11. The circuit of claim 1, wherein the at least one audio signal input is analog.

12. An apparatus, the apparatus comprising:
    a gain control circuit for volume control receiving at least one audio signal input, including:
       an output signal regulator receiving a first portion of the at least one audio signal input, the regulator being able to vary an amplitude of the first portion of the at least one audio signal input when a control signal from a circuit controller is received;
       the circuit controller being powered by a DC generator; and
       the DC generator receiving a second portion of the at least one audio signal input,
       wherein a signal from the output signal regulator is passed through an acoustic generator,
       wherein the output signal regulator is configurable for determining a predetermined level for the amplitude of the at least one audio signal input, and
       wherein the control signal from the circuit controller is receivable by the output signal regulator when the amplitude of the at least one audio signal input exceeds the predetermined level.

13. A method for volume control, including:
    receiving at least one audio signal;
    dividing the at least one audio signal into a first portion passing into an output signal regulator and a second portion passing into a DC generator, the output signal regulator being configurable for determining a predetermined level;

activating the output signal regulator to vary an amplitude of the first portion of the at least one audio signal when a control signal from a circuit controller is received, the control signal being communicable from the circuit controller when an amplitude of the at least one audio signal input exceeds the predetermined level; and passing a signal from the output signal regulator into an acoustic generator, wherein the output signal regulator is configurable for receiving an ambient environment audio input which is usable for determining the predetermined level.

14. The method of claim 13, wherein the DC generator powers the circuit controller.

15. The method of claim 13, wherein the first portion is substantially more than the second portion.

16. The method of claim 13, wherein the at least one audio signal is received via either a wired connection or a wireless connection.

17. The method of claim 13, wherein the output signal regulator varies the amplitude of the at least one audio signal input by reducing the amplitude.

18. The method of claim 13, wherein the at least one audio signal input is analog.

19. An apparatus, the apparatus comprising:

a gain control circuit for volume control, the circuit configured to:

receive at least one audio signal;

divide the at least one audio signal into a first portion passing into an output signal regulator and a second portion passing into a DC generator, the output signal regulator being configurable for determining a predetermined level;

activate the output signal regulator to vary an amplitude of the first portion of the at least one audio signal when a control signal from a circuit controller is received, the control signal being communicable from the circuit controller when an amplitude of the at least one audio signal input exceeds the predetermined level; and pass a signal from the output signal regulator into an acoustic generator, wherein the output signal regulator is configurable for receiving an ambient environment audio input which is usable for determining the predetermined level.

* * * * *